(12) United States Patent
Cannon

(10) Patent No.: US 7,116,120 B1
(45) Date of Patent: Oct. 3, 2006

(54) CLAMPING TEST FIXTURE FOR A HIGH FREQUENCY MINIATURE PROBE ASSEMBLY

(75) Inventor: James E. Cannon, Black Forrest, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/221,030

(22) Filed: Sep. 7, 2005

(51) Int. Cl.
*G01R 31/02* (2006.01)

(52) U.S. Cl. .................... 324/754; 324/757; 324/158.1

(58) Field of Classification Search ................ None
See application file for complete search history.

(56) References Cited

U.S. PATENT DOCUMENTS 4,225,819 A * 9/1980 Grau et al. ................. 324/415
5,614,820 A * 3/1997 Aoyama et al. .......... 324/158.1
6,515,498 B1 * 2/2003 Kobayashi et al. ......... 324/757

\* cited by examiner

*Primary Examiner*—Minh N. Tang

(57) ABSTRACT

An oscilloscope probe test fixture provides separate clamps for pressing each probe tip against a location along a transmission line. Multiple adjacent clamps may share a common axle. One clamp is positioned over a ground plane that adjoins the center conductor of a strip transmission line, while another is positioned over that center conductor. Each individual clamp has a respective compression spring on one side of the axle to produce clamping on the other, and the lengths from the axle to the springs act as a respective thumb lever that allows each clamp to be opened to receive a probe tip. The length from the axle to the spring is significantly longer than that from the axle to the actual clamping surface (foot) to provide increased clamping force. The foot of each clamp is mostly under the axle, while their thumb lever portions extend parallel to a substrate that carries the strip transmission line, allowing the location of the clamping to be close to the driven end of the test fixture. The transmission line may be internally terminated or terminated externally through an RF connector.

16 Claims, 6 Drawing Sheets

CLAMPING TEST FIXTURE FOR A HIGH FREQUENCY MINIATURE PROBE ASSEMBLY

BACKGROUND OF THE INVENTION

Modern high frequency oscilloscope probes are often fabricated as active differential probes. A differential probe has two applied signals whose difference is formed and taken as the desired input signal. With reference now to FIG. 1, one such prior art probing arrangement 1 for a digital oscilloscope 3 from Agilent Technologies has a relatively high frequency amplifier (not shown) that is carried within a housing 2 that connects to the 'scope 3 through a three or four foot long cable 4 ending in an attachment assembly 5, and that couples to the circuit or device under test through fairly short (four to six inches) lengths of flexible small diameter coaxial transmission lines 6 whose distal ends may have a hand-held 'browser' that carries the actual probe tips (the figure doesn't show a browser—keep reading). The browser is a small assembly that includes impedance matching elements or other passive networks interposed between the short flexible transmission lines and the actual probe tips. Browsers are usually fairly small, as oscilloscope probes go, but are nevertheless often too large to be deployed to certain locations, say, one that is between two parallel and closely spaced printed circuit board assemblies. In such a case the hand-held browser is replaced with a solderable probe assembly 7 whose probe tips 8 are actually soldered to the locations bearing the signal to be measured. It dispenses with the handle that makes a browser hand-held, and retains just the bare minimum of ingredients needed to carry the short flexible coaxial transmission lines 6 and the impedance matching elements 9. Such a solderable probe assembly 7 might be on the order of a quarter of an inch long (excluding the probe tips), three sixteenths of an inch wide, and a sixteenth of an inch high. The probe tips 8 are short (1/16") lengths of small diameter (e.g., 0.007") nickel wire that is solderable, bendable (say, fifteen to thirty times before they break), and replaceable. A roll of replacement wire is supplied with the probe assembly, and a technician uses a microscope and a tiny soldering iron to install new probe tips.

Now refer to FIG. 2. For various well known reasons, it is desirable for there to be a calibration test fixture (10) that receives the solderable probe assembly 7. The probe's output is coupled to a 'scope input channel in the usual fashion. The calibration test fixture is (either directly, which is actually preferred, or through a cable 11) connected to a front panel calibration test signal (not shown) provided by the 'scope. Upon instructions to do so, the 'scope interprets the known calibration test signal as measured by the channel/probe assembly combination, to discover and then institute appropriate post-processing compensation of the measured results, thereby providing more accurate measurements with that particular probe assembly when used with other signals of interest.

One prior art design for a calibration test fixture 10 is embodied by the products E2655A and E2655B from Agilent Technologies. That design involves a terminated strip transmission line 12 formed on a substrate 13 and having a clamp 14 for pinching the probe tips 8 against the transmission line at one of two different possible locations indicated generally by the intersection of index marks (15) printed on the fixture with slots 16 cut into clamp 14. (The slots are there to reduce added inter-probe capacitance present when the probe tips are clamped.) Mechanically, the function of the clamp 14 is reminiscent of the stamped metal clip on an ordinary press-board or plastic clip board used to render a pad of paper portable for writing upon, save that the clamp 14 on the test fixture 10 is considerably smaller and is of an insulating material. The strip transmission line 12 may be terminated directly by a termination 17 attached to a connector 18 that is part of the fixture 10, or, optionally (and which is not shown) terminated instead through a length of coaxial transmission line that connects the downstream end of the fixture 10 to a 50 Ω measurement input of one of the channels possessed by the 'scope 3.

The design shown in FIG. 2 possesses a number of shortcomings that limit its effectiveness and convenience. Among these are that, since the clamp 14 is a unitary item used for both probe tips, the probe assembly 7 has to be correctly positioned beneath an opened clamp to correctly align both probe tips at the same time before the clamp is released. Misaligned probe tips will introduce a false skew into the measured result, and is a condition that is to be avoided. However, it is difficult to achieve proper alignment with the clamp open and then maintain it while closing the clamp; things tend to wiggle around too much. Furthermore, despite the modest clamping force provided, it is also difficult to coerce the clamped probe tips to change their position beneath the clamp; they might rather bend or break, especially if they have been in use for some time.

Next, the clamping force is not always sufficient to retain a clamped probe. This follows in part from the springs 19 and in part from the nearly central location of the pivot 20 between the springs and the clamping edge 21. However, there is a limit to merely making the springs stiffer; the clamping edge 21 tends to bow when it encounters the probe tips 8, reducing the force applied to the probe tips. A related issue concerning the particular clamp 14 is that its overall length forces the location of the connection between the probe tips 8 and the transmission line 12 to be toward the middle of the test fixture 10. This is not fatal, but in situations involving the highest frequencies and where greatest accuracy is sought, the cable 11 will be absent in favor of directly connecting the fixture to the connector on the 'scope's front panel, and it would further be desirable if the location along the transmission line 12 touched by the probe tips 8 were as close to the 'scope as practical. Lastly, experience has shown that the arrangement shown in FIG. 2 lends itself to straightening the probe tips and then clamping them by laying the probe assembly 7 flat against the substrate 13 (and then leaving things that way . . . ). This is a bad habit that is unfortunately encouraged by the design. (It is bad, as the proximity of the probe's grounded shield disturbs the strip transmission line 12.)

It would be desirable if there were an alternate design that both clamped the probe tips with greater force and that allowed individual probe tips to be clamped one at a time, so as to permit an iterative series of adjustments to get both probe tips clamped in their proper locations. Furthermore, that proper location ought to be as close as practical to the driven end of the test fixture.

SUMMARY OF THE INVENTION

A solution to the problem of allowing iterative adjustment of differential probe assembly tips against a strip transmission line in a test fixture is to provide separate clamps for each probe tip. In a preferred embodiment three adjacent clamps share a common axle; a two-clamp embodiment is also possible. In a three clamp embodiment, the two outside clamps are positioned over the respective ground planes that adjoin the center conductor of the transmission line, while the center clamp is positioned over that center conductor. The three clamps are separated by intervening spacer washers, while the group as a whole is biased along the axle and against an end spacer that locates the whole group relative to the transmission line. Each individual clamp has a respective compression spring on one side of the axle to produce clamping on the other side, and the lengths from the axle to the springs act as a respective thumb lever that allows each clamp to be opened to receive a probe tip. The length from the axle to the spring is significantly longer than that from the axle to the actual clamping surface, providing for greatly increased clamping force (each clamp is a separate first class lever). The foot of each clamp that does the actual compression of a probe tip against the transmission line is mostly under the axle, while their thumb lever portions extend parallel to the substrate that carries the strip transmission line. This allows the location of the clamping to be very close to the driven end of the test fixture. The transmission line is driven by an applied test signal delivered through a first external bulkhead mount RF connector. The multi-clamp fixture's strip transmission line can be terminated by an internal termination, by an external bulkhead mount termination, by a termination affixed to a second external bulkhead mount RF connector, or by a distant termination at another measurement input of the 'scope reached with an intervening coaxial RF transmission line (cable).

DESCRIPTION OF A PREFERRED EMBODIMENT

Figure 1:
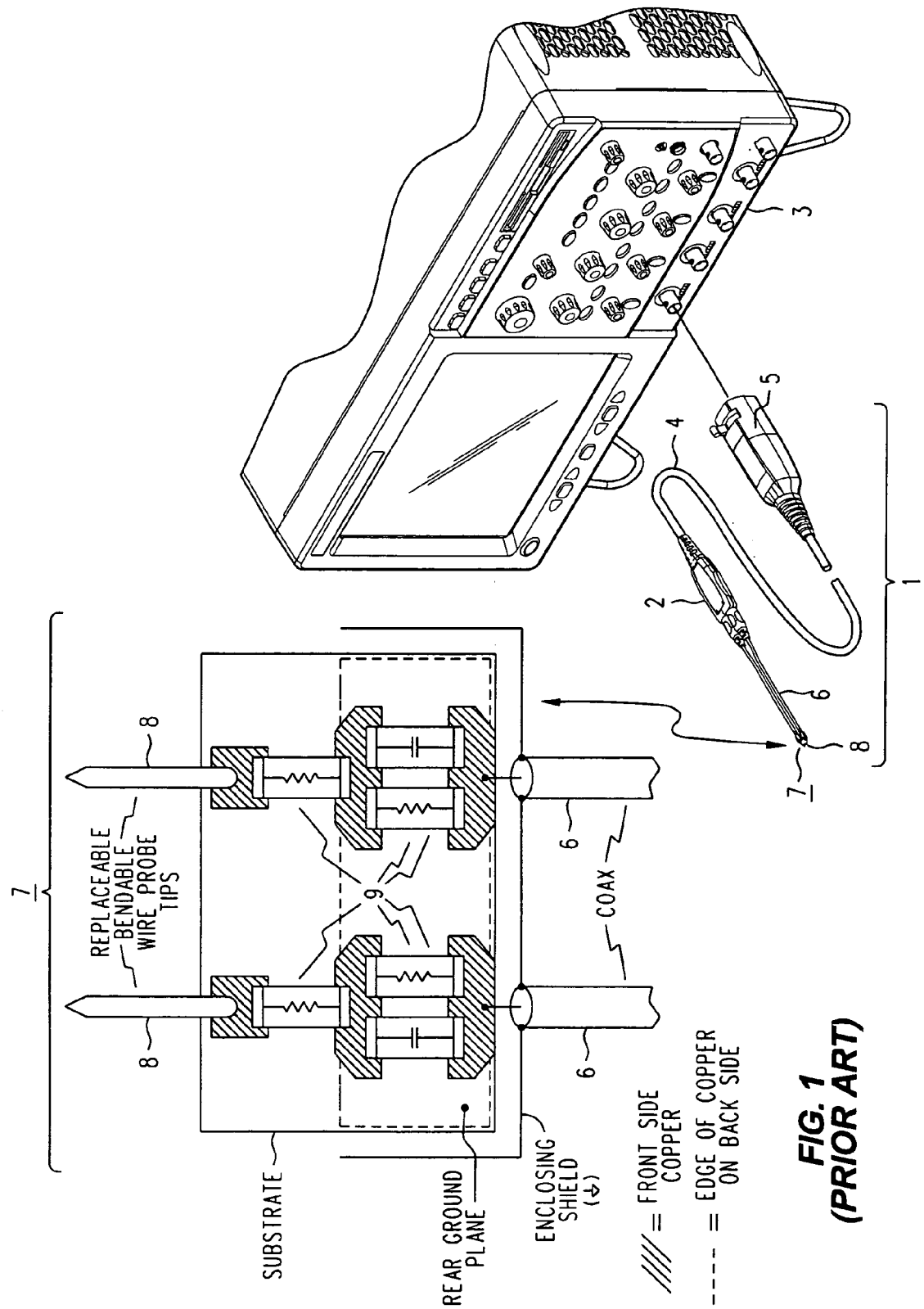
FIG. 1 is a simplified composite view of a prior art oscilloscope system including a solderable probe assembly that is to be used with a calibration test fixture (not shown)
Figure 2:
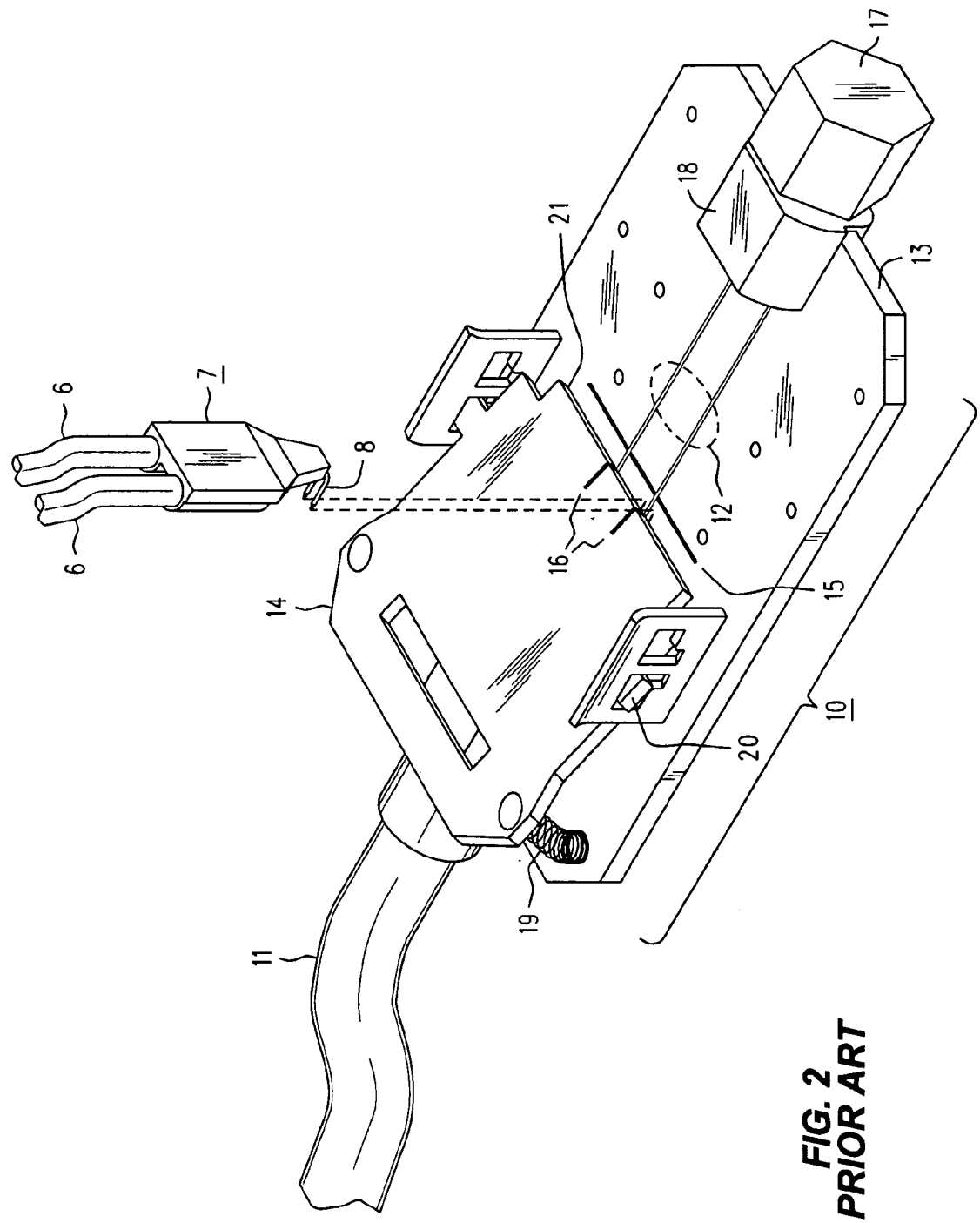
FIG. 2 is a perspective view of a prior art single clamp calibration test fixture for use with the solderable probe assembly of FIG. 1.
Figure 3:
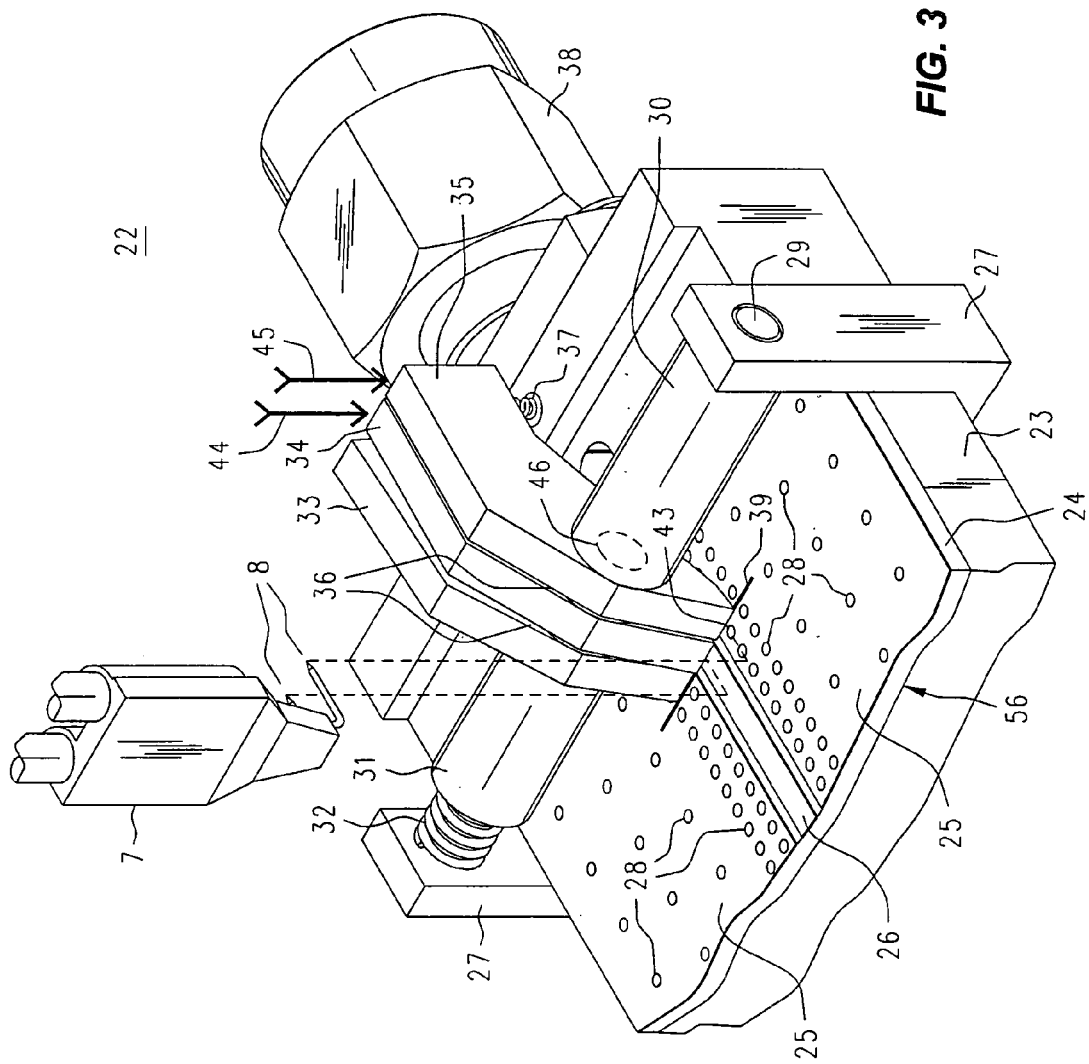
FIG. 3 is a first perspective view of an improved multi-clamp calibration test fixture.

Refer now to FIG. 3, wherein is shown a partial perspective view of an improved calibration test fixture 22 having multiple (three) clamps for a high frequency differential solderable probe assembly 7 to be used with a digital oscilloscope 3. (A brief look at FIG. 4 may also be useful at this point, where the same structure is shown in its entirety from another location for the eye.) A carrier 23 serves as a chassis upon which are mounted various other components whose descriptions are given below. The carrier 23 may be of metal, such as copper, brass or aluminum, as a metallic carrier is preferred for strength, durability, and ease of promoting a good RF ground. That is not to say that we can't imagine a plastic carrier—we can, but we prefer a metal one. The chassis functions of the carrier 23 are: (1) To carry a substrate 24 (which may be of any suitable dielectric, such as ceramic or FR4) that has a strip transmission line that is driven by the test signal and that is contacted by the probe tips of a solderable probe assembly 7; (2) To serve as a bulkhead for mounting an RF connector 38 through which the test signal is applied to an input end of the strip transmission line, and also (in some embodiments) as a bulkhead for mounting either another connector or termination (40 in FIG. 4) coupled to an output end of the transmission line; and, (3) To carry a yoke 27 through which various clamping components are mounted to individually clamp the probe tips 8 against the strip transmission line.

Let us begin with the substrate 24 and its strip transmission line. The top surface of the substrate 24 carries two ground planes 25 on either side of a center conductor 26. The underside of the substrate 24 carries a ground plane 56 that extends the full width and length of the substrate. A suitably dense pattern of vias 28 connects the upper ground plane portions 25 to the lower ground plane 56. The lower ground plane 56 is also affixed to the metallic carrier 23 with a conductive adhesive, so that it is in intimate electrical contact with the metallic carrier, the better to serve as an extension of the outer conductor of the input (coaxial) RF connector 38 (and also be similarly well connected to the outer shield of the output coaxial connector or termination 40).

The center conductor 26 is of such a width that when one of the probe tips 8 is in contact with it, that the other probe tip is safely over (in the sense of within the confines, or extent of) one or the other of the ground plane portions 25. It will, of course, be understood, that the center conductor 26 is electrically connected (e.g., soldered) at one end to the center conductor of the connector 38 and to the center conductor of the connector or termination 40 at the other, both of which (38, 40) are preferably bulkhead style components that are attached (e.g., by screws) to their respective ends of the carrier 23.

The yoke 27 may be of metal, and affixed by small screws (not shown) to the underside of the carrier 23. AS an alternative, the yoke could be an integral part of the carrier, rather than be an attached separate part (e.g., it could be a portion of a cast or molded yoke). The yoke mounts an axle 29 that carries three individual levers (clamps) 33, 34 and 35. (A two clamp/lever embodiment is also possible.) To this end, each lever has a bore therethrough to pass the axle 29; the location of the associated bore 46 in lever 35 is indicated by dotted lines. The levers are registered along the axis into their proper positions above the transmission line portions by hollow spacers, or standoffs, 30 and 31, in conjunction with a bias spring 32. Thin spacer washers 36 (not entirely visible) may be carried by the axle to separate lever 33 from 34, and to separate lever 34 from 35. An alternative to spacer washers 36 is for the levers to each have a raised plateau, or hub, in the vicinity of the bore for the axle. The reason for spacing the levers apart is to, if necessary during manufacture or repair, allow their alignment to the transmission line portions, as well as to provide some separation that assists in allowing just one lever at a time to be operated. A further reason is to minimize the amount of added inter-probe capacitance present when the probe tips are held by the clamps. In a three lever/clamp embodiment one lever (34) would be positioned over the center conductor 26 of the transmission line, while the other two would be positioned over the different ground plane portions 25. In a two lever/clamp embodiment one lever (34) would be positioned over the center conductor 26 of the transmission line, while the other would be positioned over just one of the ground plane portions 25. In either case the center-to-center spacing of adjacent levers matches the center-to-center spacing of the probe tips 8.

In connection with this business of operating one lever at a time, the reader is asked to note the following. It may appear that in a three lever embodiment it would be difficult to operate the center lever 34 in isolation. Perhaps so, but upon reflection it will be appreciated that it is never necessary to do that, since there are but two probe tips and they always occupy positions corresponding to adjacent levers. One of those will always be the center lever, as one of the probe tips will always be in contact with the center conductor 26. Now, if levers 34 and 35 are in use, then center lever 34 can be pressed in conjunction with lever 33, as lever 33 is not in use and pressing it is a harmless action. However, it may be easier to press the 33/34 combination that it is to press lever 34 in isolation. A mirror image situation occurs if levers 33 and 34 are to be in use; then pressing lever 35 at the same time as lever 34 is an easy way to activate lever 34.

Figure 5:
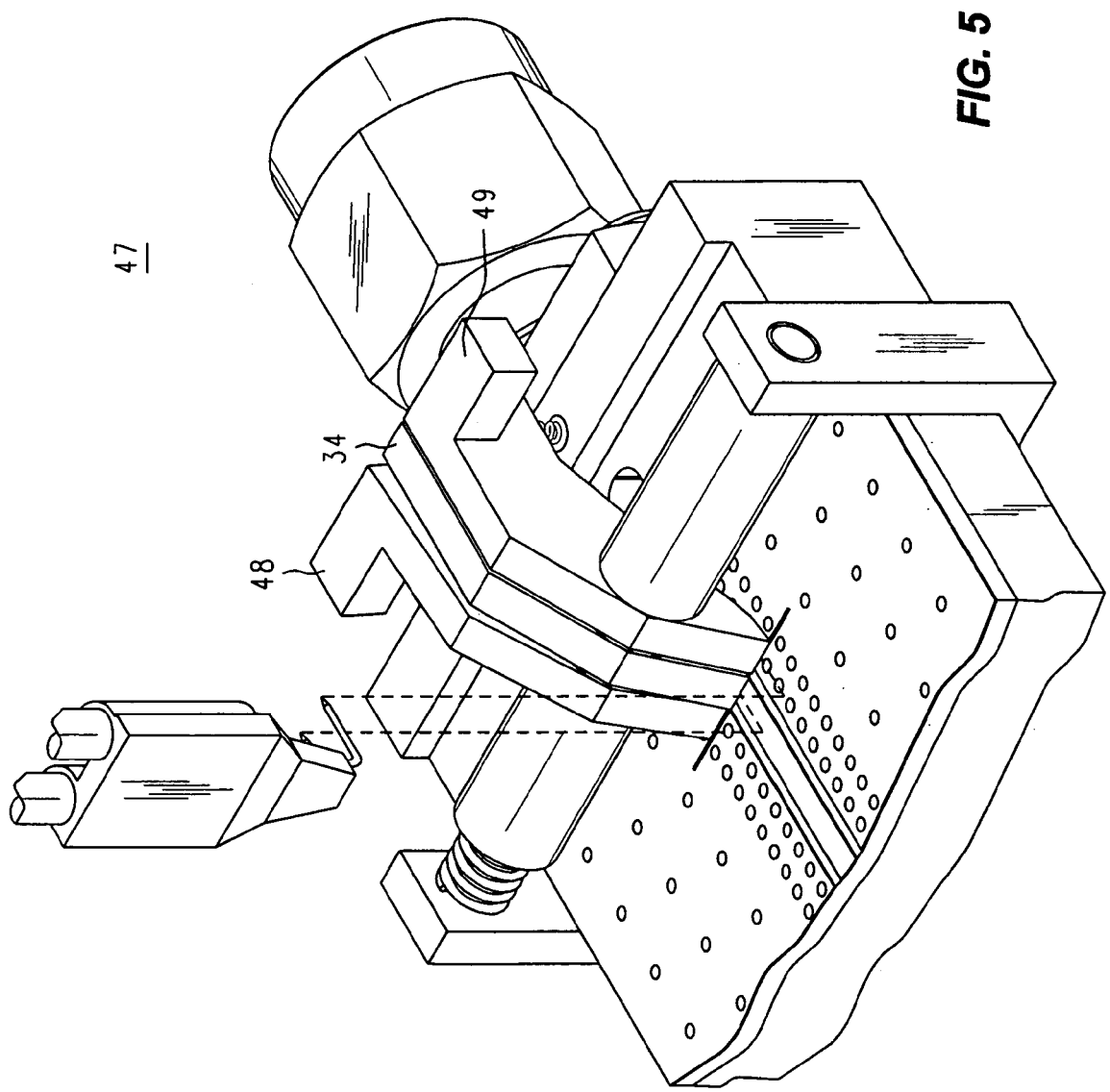
FIG. 5 is a perspective view of one alternate embodiment of the multi-clamp test fixture of FIGS. 3 and 4.

Lastly, one could add 'bent handle extensions' to the ends of the outside levers, as shown in FIG. 5. These may be used to aid in activating an outside lever in isolation (e.g., just 35 when 34 and 35 are the levers in use).

Now consider how the probe tips 8 are brought into contact with the transmission line. First, the user bends them as shown to be at a right angle to the housing of the probe assembly 7, and to be parallel (or nearly so) with each other. Using pressure from a thumb or fingernail the user depresses one (or perhaps more than one) of levers 33–35, as shown by arrows 44 and 45 for levers 34 and 35, respectively. The user then slides each probe tip under a raised 'foot' (i.e., at the opposite end) of the depressed lever(s). (Lever 35 has foot 43.) Releasing the levers allows spring tension from spring 37 (and from 41/42 in FIG. 4) to pinch each probe tip 8 between an associated foot and the top surface (i.e., the transmission line) of the substrate 24. The levers 33–35 are each separate and are individually biased, allowing the position of the probe assembly 7 in the test fixture 22 to be easily adjusted, one probe tip at a time. This is done by releasing one lever at a time (while the probe assembly 7 remains captive, since the other probe tip continues to be pinched) and wiggling the loose probe tip into a better position. Then the position of the other probe tip can be similarly adjusted, until in an iterative fashion both probe tips are brought into contact with the transmission line at the same location along its length. The preferred such location may be indicated by an index line 39 on the top surface of the substrate 24.

Figure 4:
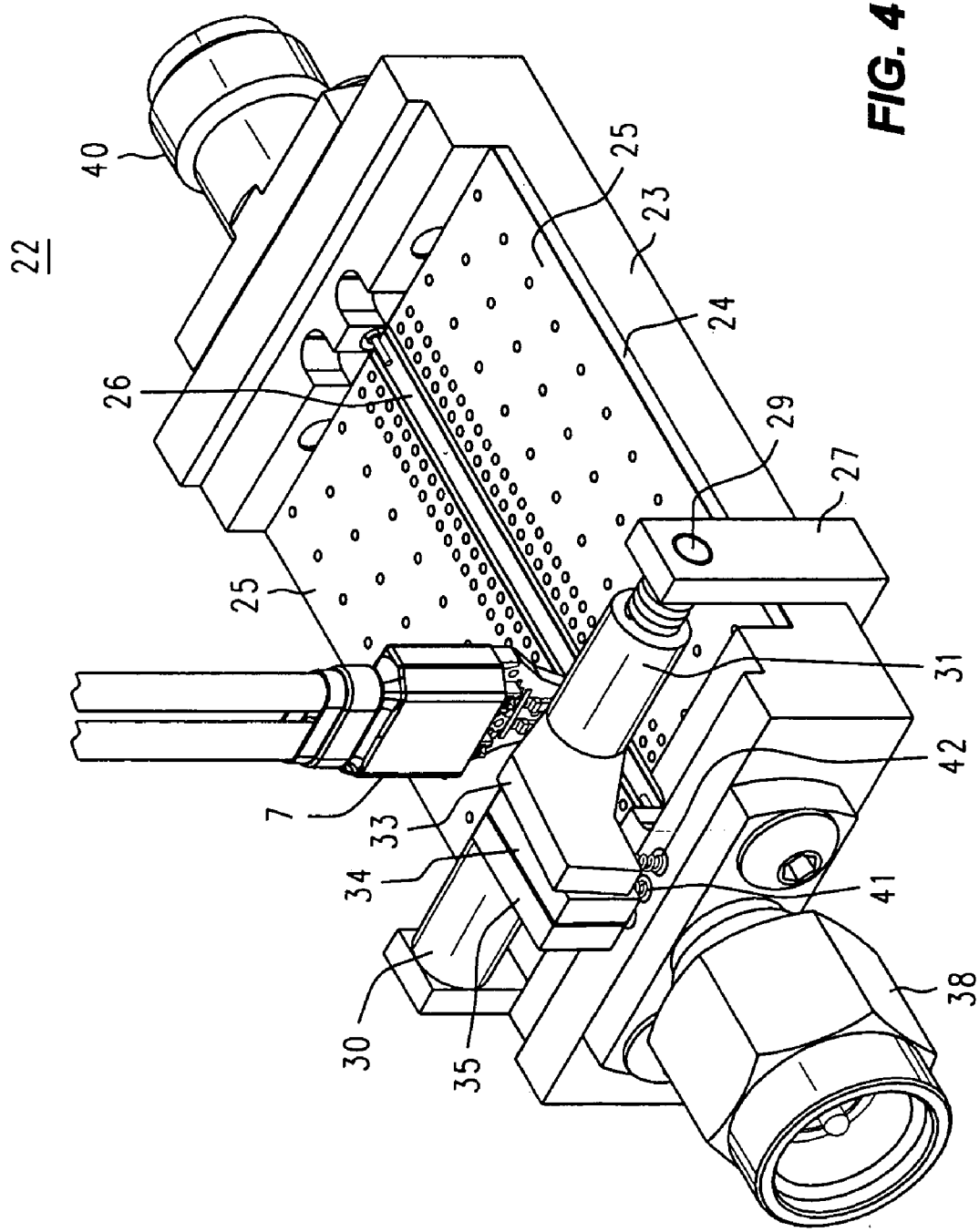
FIG. 4 is a second perspective view of the multi-clamp calibration test fixture of FIG. 3, but from a generally opposite direction.

Now refer to FIG. 4. In this figure the test fixture is viewed from the opposite direction. All the circumstances are the same as in FIG. 3, save for the direction of viewing, and items in the figure have retained their reference numbers. FIG. 4 affords a better view of the (input) RF connector 38 (preferably a precision APC 3.5 mm connector) and its preferred method of mounting, and it also shows the lever springs 41 and 42, which were obscured in the view of FIG. 3. Now consider item 40 in FIG. 4, which also was not visible in FIG. 3. Item 40 may be another RF connector, or it may be a permanently attached termination for the strip transmission line on the substrate 24. If it is another connector, then it is expected that either a termination will be affixed thereto, or that a length of transmission line will be attached to it, and that which in turn is terminated by a connection to one of the 'scope's input channels. It might instead be an RF termination for the transmission line, and not an actual connector.

It will be appreciated from both FIGS. 3 and 4 that connector 38 is the input connector. That is, the calibration test signal provided by the 'scope (or perhaps by some other item of test equipment) is applied to the calibration test fixture 22 through the input connector 38. As previously mentioned, the arrangement shown allows the probe assembly 7 to be as close as practical to connector 38.

Refer now to FIG. 5, wherein is shown an alternate embodiment 47 of the multi-clamp test fixture. Note that in this alternate embodiment the outside levers 48 and 49 have extended 'thumb-pad' regions that make it easier for those levers to be actuated in isolation (i.e., as the only lever actuated). It will be recalled from an earlier discussion that it ought not to be necessary to equip the center lever 34 with such an extension, as there is not ever any need to actuate it in isolation—its actuation can always be combined with that of one of the outside levers 48 and 49. Nevertheless, if it deemed desirable, the center lever 34 could also receive some sort of extension, say, by simply being made longer, or by having a raised topmost surface that causes it to extend above the surface of the other levers.

Figure 6:
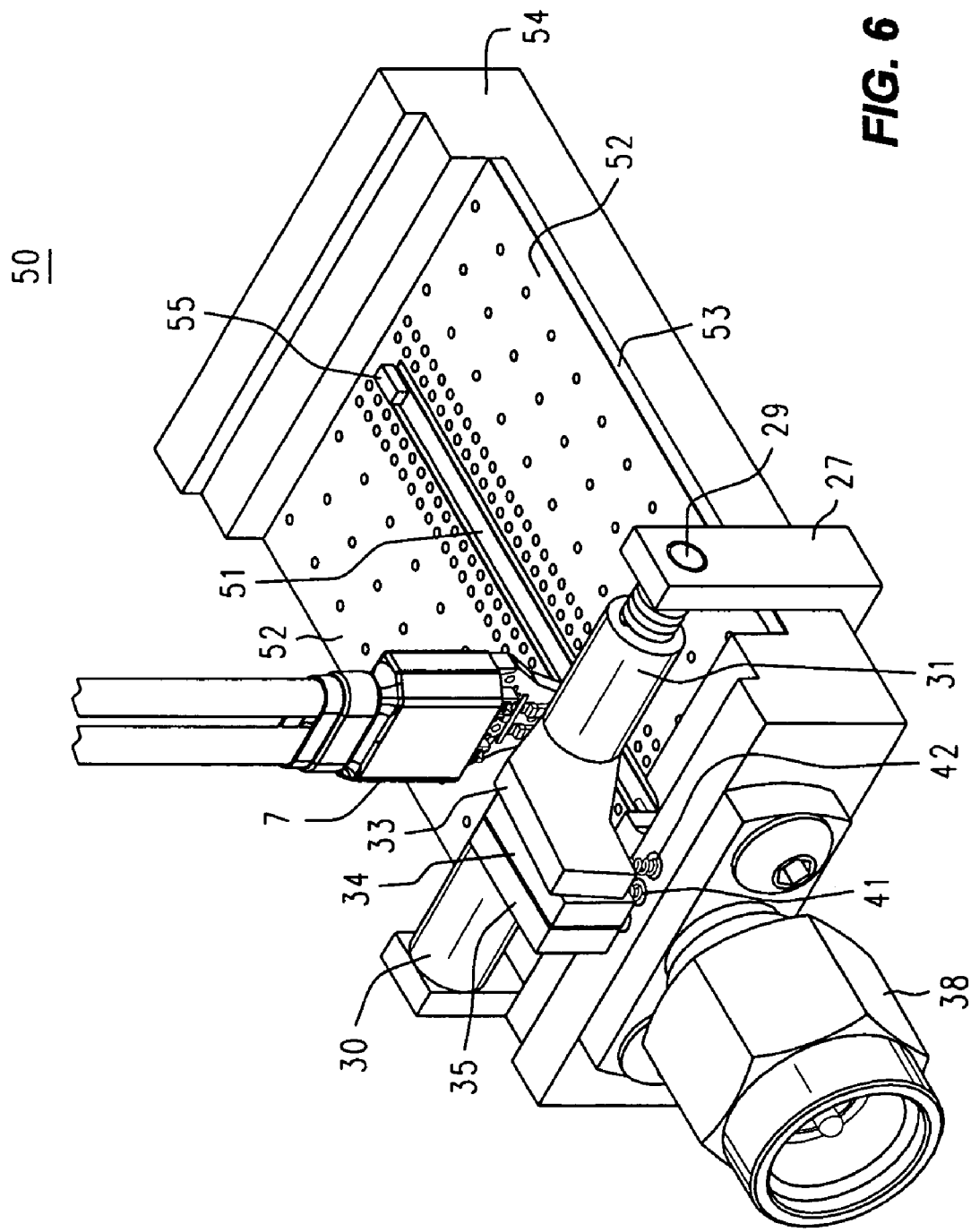
FIG. 6 is a perspective view of another alternate embodiment of the multi-clamp test fixture of FIGS. 3 and 4.

Refer now to FIG. 6, wherein is shown another alternate embodiment 50 of the multi-clamp test fixture. This embodiment would be useful in cases where the signal applied to the transmission line is (in addition to being measured by the probe assembly 7 under test) always simply terminated and never applied back to an input channel of the 'scope. In such a case the need for a second RF connector (or bulkhead mount 'external' termination) can be eliminated from a somewhat simplified carrier 54 by including a suitable ('internal') termination right on the transmission line itself. Accordingly, FIG. 6 shows a multi-clamp test fixture embodiment 50 where the second RF connector/termination (40 in FIG. 4) is absent, and the transmission line (52, 51, 52) on the substrate 53 is terminated by a resistive termination (e.g., a surface mount 50 Ω resistor) 55. Various other reference numbers in this figure that represent elements that remain unchanged from previous figures are the same as in those figures.

Finally, we have described a multi-clamp test fixture for a differential oscilloscope probe whose 'business end' is a solderable probe assembly. This is because most high frequency probes are differential. But it will be appreciated that a probe (and even a high frequency one) might otherwise have a 'single-ended' input that is expressly referenced to a signal ground. In such a case the probe is still a two-probe-tip affair: a single 'input' and a ground. It is readily appreciated that the multi-clamp text fixture described above is quite usable with such single-ended probe assemblies, and is not limited to use with just probes having differential inputs.

I claim:

1. A test fixture for an oscilloscope probe, the test fixture comprising:
    a carrier having first and second ends separated by an intervening region;
    a first RF connector disposed upon the first end of the carrier;
    a dielectric substrate disposed upon the intervening region of the carrier and having at least one metallic surface upon which is patterned a transmission line having at least first and second conductors;
    a first conductor of the first RF connector connected to the first conductor of the transmission line and a second conductor of the first RF connector connected to the second conductor of the transmission line;
    an axle disposed above the dielectric substrate such that the dielectric substrate is between the axle and the intervening region of the carrier, and also such that the axle is parallel to the metallic surface upon which is patterned the transmission line and generally at a right angle to an axis of one of the conductors of the transmission line;

first and second levers each having a bore therethrough and through which the axle passes to carry those levers, each lever having a foot portion on one side of its bore and a handle portion on the other;

the first and second levers being positioned such that rotation of one of the levers about the axle brings its foot portion into contact with the first conductor of the transmission line and that rotation of the other of the levers about the axle brings its foot portion into contact with the second conductor of the transmission line; and first and second springs, respectively disposed between the first and second levers and the carrier, the first and second springs urging the foot portions of the first and second levers against the dielectric substrate.

2. A test fixture as in claim 1 further comprising a second RF connector disposed upon the second end of the carrier and coupled to the transmission line.

3. A test fixture as in claim 1 further comprising an RF termination disposed upon the second end of the carrier and coupled to the transmission line.

4. A test fixture as in claim 1 further comprising an RF termination resistor connected to the transmission line at a distal end thereof relative to where the first RF connector is connected to the transmission line.

5. A test fixture as in claim 1 further comprising a yoke portion extending from the carrier and that carries the axle.

6. A test fixture as in claim 5 further comprising spacers captive upon the axle and retained by the yoke portion, that register the first and second levers over the first and second conductors of the transmission line.

7. A test fixture as in claim 6 further comprising a bias mechanism that urges the spacers and the first and second levers in a direction along the axle and against a surface of the yoke portion.

8. A test fixture for an oscilloscope probe, the test fixture comprising:

a carrier having first and second ends separated by an intervening region;

a first coaxial RF connector disposed upon the first end of the carrier;

a dielectric substrate disposed upon the intervening region of the carrier and having at least one metallic surface upon which is patterned a strip transmission line having a center conductor and two adjacent ground planes;

the center conductor of the first coaxial RF connector connected to the center conductor of the strip transmission line;

an axle disposed above the dielectric substrate such that the dielectric substrate is between the axle and the flat region of the carrier, and also such that the axle is parallel to the metallic surface upon which is patterned the strip transmission line and generally at a right angle to an axis of the center conductor of the strip transmission line;

first and second levers each having a bore therethrough and through which the axle passes to carry those levers, each lever having a foot portion on one side of its bore and a handle portion on the other;

the first and second levers being positioned such that rotation of one of the levers about the axle brings its foot portion into contact with the center conductor of the strip transmission line and that rotation of the other of the levers about the axle brings its foot portion into contact with one of the adjacent ground planes; and first and second springs, respectively disposed between the first and second levers and the carrier, the first and second springs urging the foot portions of the first and second levers against the dielectric substrate.

9. A test fixture as in claim 8 further comprising a second RF connector disposed upon the second end of the carrier and coupled to the strip transmission line.

10. A test fixture as in claim 8 further comprising an RF termination disposed upon the second end of the carrier and coupled to the strip transmission line.

11. A test fixture as in claim 8 further comprising an RF termination resistor connected to the strip transmission line at a distal end thereof relative to where the first RF connector is connected to the strip transmission line.

12. A test fixture as in claim 8 further comprising a yoke portion extending from the carrier and that carries the axle.

13. A test fixture as in claim 12 further comprising spacers captive upon the axle and retained by the yoke portion, that register the first and second levers over their respective elements of the strip transmission line.

14. A test fixture as in claim 13 further comprising a bias mechanism that urges the spacers and the first and second levers in a direction along the axle and against a surface of the yoke portion.

15. A test fixture as in claim 8 further comprising a third lever having a bore therethrough and through which the axle passes, having a foot portion on one side of its bore and a handle portion on the other, the third lever being positioned such that rotation about the axle brings its foot portion into contact with an adjacent ground plane not contacted by a foot portion of either of the first and second levers.

16. A test fixture as in claim 15 wherein the third lever and whichever of the first and second levers is positioned over a ground plane outside levers separated by the intervening remaining lever, and further wherein those outside levers have extended handle portions that project in generally opposite directions.

* * * * *